US012610585B2

(12) United States Patent
Li

(10) Patent No.: US 12,610,585 B2
(45) Date of Patent: Apr. 21, 2026

(54) SEMICONDUCTOR STRUCTURE AND METHOD FOR MANUFACTURING SAME

(71) Applicant: CHANGXIN MEMORY TECHNOLOGIES, INC., Hefei City (CN)

(72) Inventor: Min Li, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 733 days.

(21) Appl. No.: 17/954,625

(22) Filed: Sep. 28, 2022

(65) Prior Publication Data

US 2023/0017879 A1     Jan. 19, 2023

(30) Foreign Application Priority Data

May 26, 2022     (CN) .......................... 202210589249.5

(51) Int. Cl.
H10D 30/67 (2025.01)
H10D 62/13 (2025.01)
H10D 84/01 (2025.01)
H10D 84/03 (2025.01)

(52) U.S. Cl.
CPC ....... H10D 30/6735 (2025.01); H10D 62/151 (2025.01); H10D 84/013 (2025.01); H10D 84/038 (2025.01)

(58) Field of Classification Search
CPC .. H10D 30/6735; H10D 30/025; H10D 30/63; H10D 30/6719; H10D 30/6728; H10D 62/151; H10D 84/013; H10D 84/038; H10D 84/016; H10D 84/83
See application file for complete search history.

(56) References Cited

U.S. PATENT DOCUMENTS

| | | | |
|---|---|---|---|
| 2005/0037557 A1* | 2/2005 | Doczy | C22C 27/00 |
| | | | 438/197 |
| 2019/0363187 A1 | 11/2019 | You et al. | |
| 2020/0144378 A1* | 5/2020 | Lee | H10D 30/751 |
| 2020/0185384 A1* | 6/2020 | Li | H10D 62/122 |
| 2025/0062253 A1* | 2/2025 | Koo | H10D 62/115 |

FOREIGN PATENT DOCUMENTS

CN         110265358  A  *  9/2019  ............. H10D 84/83

* cited by examiner

*Primary Examiner* — Sitaramarao S Yechuri
(74) *Attorney, Agent, or Firm* — Syncoda LLC; Feng Ma

(57)         ABSTRACT

A semiconductor structure and a method for manufacturing same are provided. The semiconductor structure includes: a substrate, and a first transistor and a second transistor protruding from the substrate. The first transistor at least includes a first doped region and a second doped region arranged from bottom to top. The second transistor at least includes a third doped region and a fourth doped region arranged from bottom to top. Herein, the first doped region and the third doped region have a first conductivity type, the second doped region and the fourth doped region have a second conductivity type, and a breakdown voltage of the first transistor is smaller than a breakdown voltage of the second transistor.

14 Claims, 25 Drawing Sheets

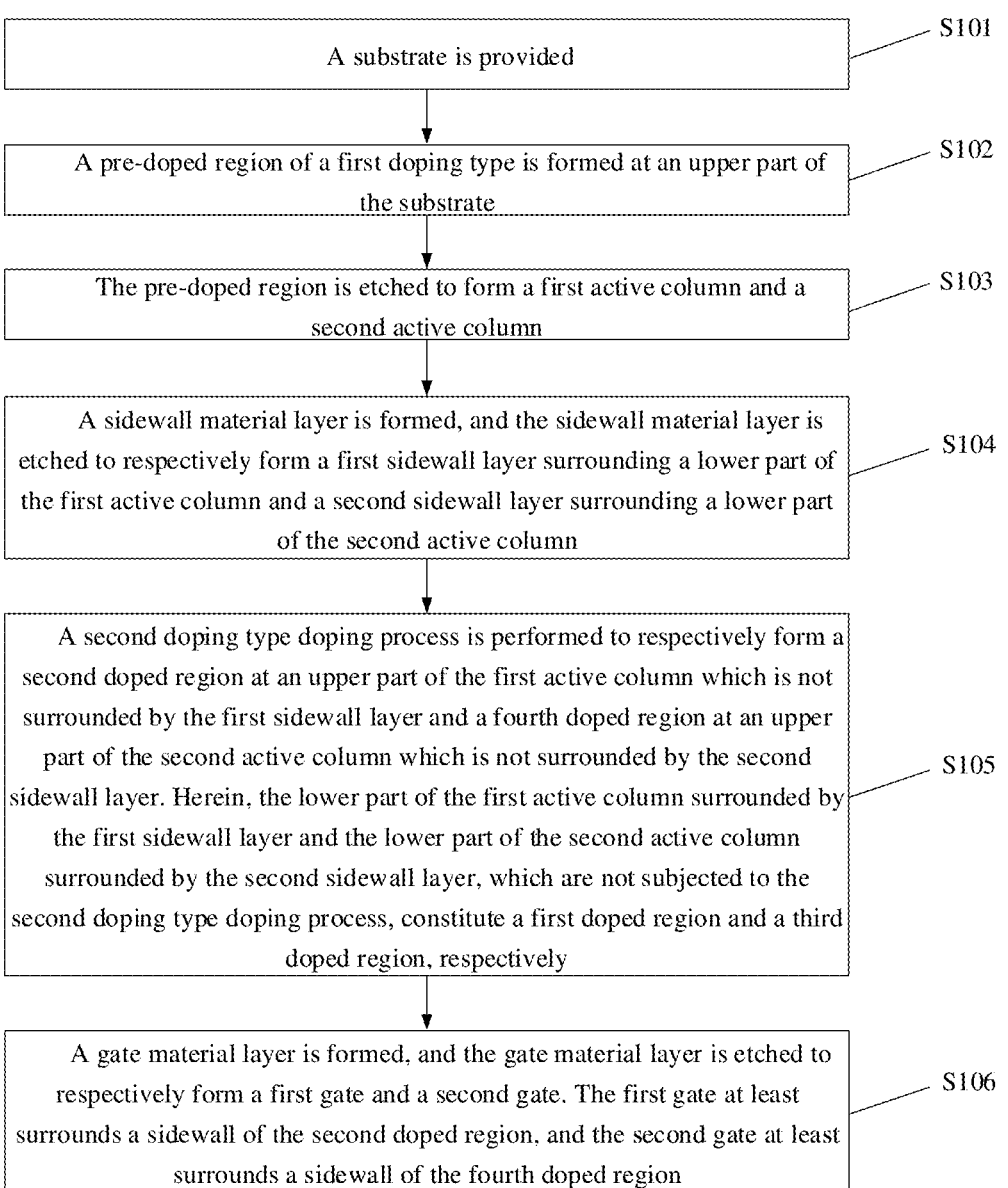

A substrate is provided    — S101

A pre-doped region of a first doping type is formed at an upper part of the substrate    — S102

The pre-doped region is etched to form a first active column and a second active column    — S103

A sidewall material layer is formed, and the sidewall material layer is etched to respectively form a first sidewall layer surrounding a lower part of the first active column and a second sidewall layer surrounding a lower part of the second active column    — S104

A second doping type doping process is performed to respectively form a second doped region at an upper part of the first active column which is not surrounded by the first sidewall layer and a fourth doped region at an upper part of the second active column which is not surrounded by the second sidewall layer. Herein, the lower part of the first active column surrounded by the first sidewall layer and the lower part of the second active column surrounded by the second sidewall layer, which are not subjected to the second doping type doping process, constitute a first doped region and a third doped region, respectively    — S105

A gate material layer is formed, and the gate material layer is etched to respectively form a first gate and a second gate. The first gate at least surrounds a sidewall of the second doped region, and the second gate at least surrounds a sidewall of the fourth doped region    — S106

SEMICONDUCTOR STRUCTURE AND METHOD FOR MANUFACTURING SAME

CROSS-REFERENCE TO RELATED APPLICATION

The present application claims benefit of Chinese Application No. 202210589249.5, filed on May 26, 2022, the contents of which are hereby incorporated by reference in its entirety.

BACKGROUND

With the development and progress of technology, semiconductor devices are developing towards miniaturization and high integration, and the size of the semiconductor devices is becoming smaller and smaller. In some semiconductor devices with short channel length, the control ability of a gate to the channel becomes weak. In order to improve the control ability of the gate to the channel, researchers have developed transistor structures such as a Fin Field Effect Transistor and a Gate-All-Around Transistor to enhance the control ability of the gate to the channel.

However, there are still many problems in the structure of a semiconductor device that need to be solved.

SUMMARY

Embodiments of the disclosure provide a semiconductor structure. The structure may include a substrate, a first transistor and a second transistor.

The first transistor and the second transistor protrude from the substrate, the first transistor at least including a first doped region and a second doped region arranged from bottom to top, and the second transistor at least including a third doped region and a fourth doped region arranged from bottom to top.

Herein, the first doped region and the third doped region have a first conductivity type, the second doped region and the fourth doped region having a second conductivity type, and a breakdown voltage of the first transistor being smaller than a breakdown voltage of the second transistor.

The disclosure further provides a method for manufacturing a semiconductor structure, which includes the following operations.

A substrate is provided.

A pre-doped region of a first doping type is formed at an upper part of the substrate.

The pre-doped region is etched to form a first active column and a second active column.

A sidewall material layer is formed, and the sidewall material layer is etched to respectively form a first sidewall layer surrounding a lower part of the first active column and a second sidewall layer surrounding a lower part of the second active column.

A second doping type doping process is performed to respectively form a second doped region at the upper part of the first active column which is not surrounded by the first sidewall layer and a fourth doped region at the upper part of the second active column which is not surrounded by the second sidewall layer. Herein, the lower part of the first active column surrounded by the first sidewall layer and the lower part of the second active column surrounded by the second sidewall layer, which are not subjected to the second doping type doping process, constitute a first doped region and a third doped region, respectively.

A gate material layer is formed, and the gate material layer is etched to respectively form a first gate which at least surrounds the sidewall of the second doped region and a second gate which at least surrounds the sidewall of the fourth doped region.

Details of one or more embodiments of the present disclosure are set forth in the following drawings and descriptions. Other features and advantages of the present disclosure will become apparent from the description, drawings, and claims.

BRIEF DESCRIPTION OF THE DRAWINGS

In order to describe the technical solutions in the embodiments of the disclosure more clearly, the drawings required to be used in the embodiments will be simply introduced below. It is apparent that the drawings described below are only some embodiments of the disclosure, and other drawings may further be obtained by those of ordinary skill in the art according to the drawings without creative work.

FIG. 4 is a flow chart of a method for manufacturing a semiconductor structure according to an embodiment of the disclosure.

DETAILED DESCRIPTION

Figure 1:
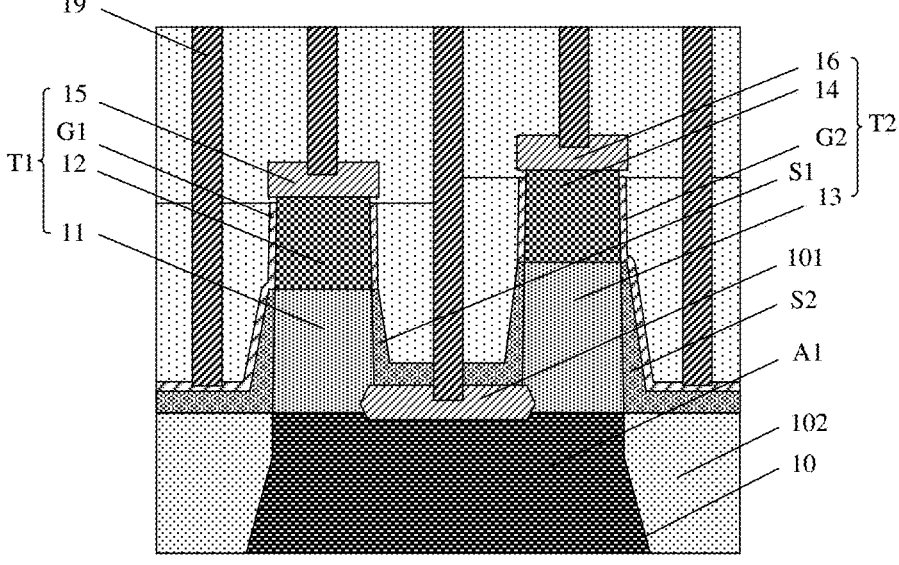
FIG. 1 is a structural schematic diagram of a structure of a semiconductor structure according to an embodiment of the disclosure.

Exemplary embodiments disclosed in the disclosure are described in more detail with reference to drawings. Although the exemplary embodiments of the disclosure are shown in the drawings, it should be understood that the disclosure may be implemented in various forms and should not be limited by the specific embodiments described here. On the contrary, these embodiments are provided for more fully understanding of the disclosure, and to completely convey a scope disclosed by the disclosure to a person skilled in the art.

In the following descriptions, a lot of specific details are given in order to provide the more fully understanding of the disclosure. However, it is apparent to a person skilled in the art that the disclosure may be implemented without one or more of these details. In other examples, in order to avoid confusion with the disclosure, some technical features well-known in the field are not described. Namely, not all of the features of an actual embodiments are described here, and well-known functions and structures are not described in detail.

In the drawings, the sizes of a layer, a region, and an element and their relative sizes may be magnified for clarity. The same reference sign represents the same element throughout.

It should be understood that while the element or the layer is referred to as being "on . . . ", "adjacent to . . . ", "connected to . . . " or "coupled to . . . " other elements or layers, it may be directly on the other elements or layers, adjacent to, connected or coupled to the other elements or layers, or an intermediate element or layer may be present. In contrast, while the element is referred to as being "directly on . . . ", "directly adjacent to . . . ", "directly connected to . . . " or "directly coupled to . . . " other elements or layers, the intermediate element or layer is not present. It should be understood that although terms first, second, third and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. While the second element, component, region, layer or section is discussed, it does not mean that the first element, component, region, layer or section is necessarily present in the disclosure.

Spatial relation terms, such as "under . . . ", "below . . . ", "lower", "underneath . . . ", "above . . . ", "upper" and the like, may be used here for conveniently describing a relationship between one element or feature shown in the drawings and other elements or features. It should be understood that in addition to orientations shown in the drawings, the spatial relation terms are intended to further include the different orientations of a device in use and operation. For example, if the device in the drawings is turned over, then the elements or the features described as "below" or "underneath" or "under" other elements may be oriented "on" the other elements or features. Therefore, the exemplary terms "below . . . " and "under . . . " may include two orientations of up and down. The device may be otherwise oriented (rotated by 90 degrees or other orientations) and the spatial relation terms used here are interpreted accordingly.

The terms used here are only intended to describe the specific embodiments and are not limitations to the disclosure. As used here, singular forms of "a", "an" and "said/the" are also intended to include plural forms, unless otherwise clearly indicated in the context. It should also be understood that terms "composing" and/or "including", while used in the description, demonstrate the presence of the described features, integers, steps, operations, elements and/or components, but do not exclude the presence or addition of one or more other features, integers, steps, operations, elements, components, and/or groups. As used herein, a term "and/or" includes any and all combinations of related items listed.

In a semiconductor device, a transistor is an important component. Usually, a semiconductor device may include a plurality of transistor structures with different voltage endurance capabilities. These transistors are arranged in different regions of a substrate. For example, some transistors with stronger voltage endurance capability are arranged in one region while the other transistors with weaker voltage endurance capability are arranged in another region, and so on, so that the arrangement of the plurality of transistors with different voltage endurance capabilities on the substrate may be obtained.

However, when one circuit structure needs to include a plurality of transistor structures with different voltage endurance capabilities, scattered transistor structures may increase the wiring complexity. Therefore, how to effectively arrange the layout of these transistor structures and reduce the wiring complexity is a difficult problem.

In view of the above, the following technical solution of the embodiments of the disclosure is proposed.

Embodiments of the disclosure provide a semiconductor structure, including a substrate, a first transistor and a second transistor.

The first transistor and the second transistor protrude from the substrate, the first transistor at least including a first doped region and a second doped region arranged from bottom to top, and the second transistor at least including a third doped region and a fourth doped region arranged from bottom to top.

Herein, the first doped region and the third doped region have a first conductivity type, the second doped region and the fourth doped region having a second conductivity type, and a breakdown voltage of the first transistor being smaller than a breakdown voltage of the second transistor.

In the embodiments of the disclosure, two types of transistors are included: a first transistor and a second transistor. The first transistor includes a first doped region and a second doped region arranged from bottom to top. The second transistor includes a third doped region and a fourth doped region arranged from bottom to top. Herein, the first doped region and the third doped region have a first conductivity type, and the second doped region and the fourth doped region have a second conductivity type. Two types of transistor structures with different breakdown voltages may be obtained by combining and adjusting doped regions with different properties. Therefore, in the semiconductor structure provided by the embodiments of the disclosure, integration of transistor structures with different breakdown voltages is achieved.

In order to make the above objects, features and advantages of the present disclosure more apparent and understandable, detailed description is made to specific implementation modes of the disclosure with reference to the drawings. When the embodiments of the disclosure are described in detail, for convenience of explanation, the schematic diagram may be partially enlarged not according to a general scale, and the schematic diagram is only exemplary, which shall not limit the scope of protection of the present disclosure here.

Figure 2:
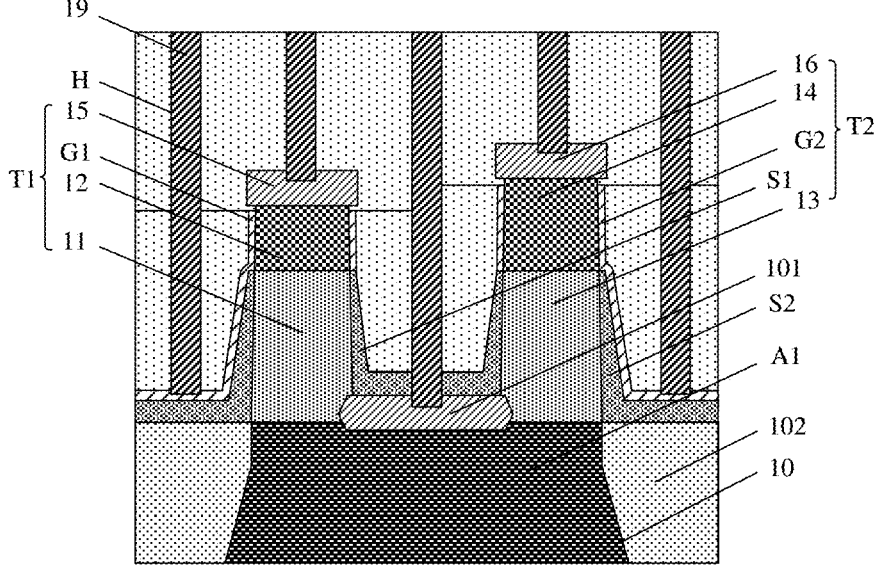
FIG. 2 is a structural schematic diagram of another structure of a semiconductor structure according to an embodiment of the disclosure.
Figure 3:
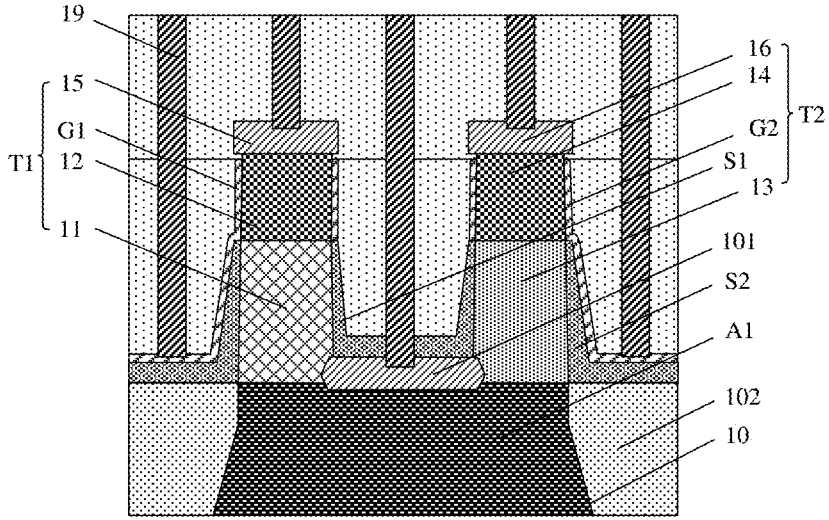
FIG. 3 is a structural schematic diagram of yet another structure of a semiconductor structure according to an embodiment of the disclosure.

FIG. 1 is a structural schematic diagram of a structure of a semiconductor structure according to an embodiment of the disclosure. FIG. 2 is a structural schematic diagram of another structure of a semiconductor structure according to an embodiment of the disclosure. FIG. 3 is a structural schematic diagram of yet another structure of a semiconductor structure according to an embodiment of the disclosure.

Further detailed description is made to the semiconductor structure according to the embodiment of the disclosure below with reference to the drawings.

As shown in FIG. 1, FIG. 2 and FIG. 3, the semiconductor structure includes a substrate 10, a first transistor T1 and a second transistor T2.

The first transistor T1 and the second transistor T2 protrude from the substrate 10, the first transistor T1 at least including a first doped region 11 and a second doped region 12 arranged from bottom to top, and the second transistor T2 at least including a third doped region 13 and a fourth doped region 14 arranged from bottom to top.

Herein, the first doped region 11 and the third doped region 13 have a first conductivity type, the second doped region 12 and the fourth doped region 14 having a second conductivity type, and a breakdown voltage of the first transistor T1 being smaller than a breakdown voltage of the second transistor T2.

Here, the substrate may be a semiconductor substrate. Specifically, the substrate may be a silicon substrate.

In some embodiments, an isolation structure 102 is further arranged in the substrate 10, and the isolation structure 102 is configured to provide an electrical insulation effect at a position where the transistor structures need to be electrically isolated.

Continuously referring to FIG. 1, FIG. 2 and FIG. 3, it is to be seen that the semiconductor structure further includes a doped well region A1. The doped well region A1 is located in the substrate 10 and below the first transistor T1 and the second transistor T2. Herein, the doped well region A1 has a first conductivity type, and the doping concentration of the doped well region A1 is higher than the doping concentration of the first doped region 11 and the third doped region 13.

In some specific embodiments, the semiconductor structure further includes a first sidewall layer S1 and a second sidewall layer S2. The first sidewall layer S1 covers the sidewall of the first doped region 11, the second sidewall layer S2 covers the sidewall of the third doped region 13, the upper surface of the first sidewall layer S1 is flush with the upper surface of the first doped region 11, and the upper surface of the second sidewall layer S2 is flush with the upper surface of the third doped region 13.

In some embodiments, the height of each of the first sidewall layer S1 and the second sidewall layer S2 is between 20 nm and 500 nm, for example, 50 nm, 100 nm, 120 nm, 150 nm, 200 nm, 300 nm, 400 nm, etc.

Here, the first sidewall layer and the second sidewall layer may be configured to protect the first doped region and the third doped region from being polluted or damaged in the production process. In addition, the first sidewall layer may also play a role of electrical isolation between the first doped region and other structures. Similarly, the second sidewall layer may also play a role of electrical isolation between the third doped region and other structures.

It is to be understood that since the upper surface of the sidewall layer is flush with the upper surface of the doped region, adjacent to the substrate, of the transistor structure, the height of the doped region, adjacent to the substrate, of the transistor structure increases when the height of the sidewall layer increases, thus extending a flow path of current flowing through the transistor. In the case where other factors are the same, the increase of height of the sidewall layer may effectively increase the breakdown voltage of the transistor structure. The breakdown voltage includes a breakdown voltage between a drain and a gate, which leads to the breakdown of a gate oxide layer, and/or a breakdown voltage between a source and a drain caused by the extension of a drain depletion region.

In addition, in the case where other factors keep constant, the increase of thickness of the sidewall layer may also improve the breakdown voltage of the semiconductor structure.

In an actual process, the first transistor T1 further includes a first gate G1, and the first gate G1 at least surrounds the sidewall of the second doped region 12. The second transistor T2 further includes a second gate G2, and the second gate G2 at least surrounds the sidewall of the fourth doped region 14.

Optionally, in some embodiments, the first gate G1 also covers the surface of the first sidewall layer S1 facing the isolation structure 102. The second gate G2 also covers the surface of the second sidewall layer S2 facing the isolation structure 102.

It is to be understood that in an actual operation, the first gate may include a first gate dielectric layer and a first gate conductive layer. Herein, the first gate dielectric layer at least surrounds the sidewall of the second doped region, and the first gate conductive layer covers the outer wall of the first gate dielectric layer. The second gate includes a second gate dielectric layer and a second gate conductive layer. The second gate dielectric layer at least surrounds the sidewall of the fourth doped region, and the second gate conductive layer covers the outer wall of the second gate dielectric layer.

In any of the embodiments in the disclosure, the semiconductor structure further includes a common source-drain region 101. The common source-drain region 101 is located on the substrate 10 between the first transistor T1 and the second transistor T2, and the common source-drain region 101 is connected to the first dope region 11 and the third doped region 13.

In an actual process, the common source-drain region 101 may be located on the doped well region A1 between the first transistor T1 and the second transistor T2. Here, the common source-drain region 101 may serve as a common source-drain region of the first transistor T1 and the second transistor T2, thereby forming an electrical connection between the first doped region 11 of the first transistor T1 and the third doped region 13 of the second transistor T2.

In the embodiment of the disclosure, the structure complexity and wiring connection complexity of the semiconductor structure are reduced through the arrangement of the common source-drain region, so that in the subsequent operation, electrical signals may be simultaneously transmitted to the two transistors by one conductive plug.

It is to be understood that in some embodiments, the first transistor and the second transistor may be used as independent transistors. That is, no common source-drain region is provided between the first transistor and the second transistor. In this case, the first doped region and the third doped region may be used as the source-drain regions of the first transistor and the second transistor adjacent to the substrate, respectively.

In some embodiments, the first transistor T1 further includes a first source-drain region 15. The first source-drain region 15 is located on the second doped region 12. The second transistor T2 further includes a second source-drain region 16, and the second source-drain region 16 is located on the fourth doped region 14.

As shown in FIG. 1, FIG. 2 and FIG. 3, the first doped region 11, the second doped region 12, the first gate G1 and the first source-drain region 15 constitute the first transistor T1, and the third doped region 13, the fourth doped region 14, the second gate G2 and the second source-drain region 16 constitute the second transistor T2.

It is to be understood that the second doped region 12 may be used as the channel region of the first transistor T1, and the fourth doped region 14 may be used as the channel region of the second transistor T2.

In some embodiments, the heights of the first transistor T1 and the second transistor T2 may be different.

In some embodiments of the disclosure, as shown in FIG. 1, the height of a structure composed of the first doped region 11 and the second doped region 12 is smaller than the height of a structure composed of the third doped region 13 and the fourth doped region 14. The height of the first doped region 11 is smaller than the height of the third doped region 13, and the heights of the second doped region 12 and the fourth doped region 14 are the same.

Here, in the case where two transistors have the same channel length, when the height of the first doped region is smaller than the height of the third doped region (in this case, the height of the first sidewall layer is smaller than the height of the second sidewall layer), the flow path of current flowing through the second transistor is extended, so that the breakdown voltage of the second transistor is larger than the breakdown voltage of the first transistor.

In addition, in the embodiment, the thickness of the first sidewall layer may also be set to be smaller than the thickness of the second sidewall layer to further increase the breakdown voltage of the second transistor.

It is to be understood that other manners may also be employed for the setting of the height relationship between the first doped region and the third doped region. In a practical operation, the height of the first doped region may also be set to be larger than the height of the third doped region (in this case, the height of the first sidewall layer is larger than the height of the second sidewall layer), and in this case, the breakdown voltage of the first transistor is higher than the breakdown voltage of the second transistor.

Thus, in the case where two transistors have the same channel length, the two transistors may have different breakdown voltages by disposing the height of the first doped region different from that of the third doped region for the two transistors (that is, the first sidewall layer and the second sidewall layer have different heights), thus achieving the integration of transistor structures with different breakdown voltages.

In addition, in the embodiment of the disclosure, the distance between the transistors with different breakdown voltages are close in structure layout, so that the wiring complexity of a circuit structure may be effectively reduced when the circuit structure needs to include transistor structures with different breakdown voltages.

In other embodiments of the disclosure, as shown in FIG. 2, the height of a structure composed of the first doped region 11 and the second doped region 12 is smaller than the height of a structure composed of the third doped region 13 and the fourth doped region 14. The height of the first doped region 11 is equal to the height of the third doped region 13, and the height of the second doped region 12 is smaller than the height of the fourth doped region 14.

Here, in the case where the first doped region and the third doped region have the same height, when the height of the second doped region is smaller than the height of the fourth doped region, the flow path of current flowing through the second transistor is extended, so that the breakdown voltage of the second transistor is larger than the breakdown voltage of the first transistor.

In addition, in the embodiment, the thickness of the first sidewall layer may also be set to be smaller than the thickness of the second sidewall layer to further increase the breakdown voltage of the second transistor.

It is to be understood that other manners may also be employed for the setting of the height relationship between the second doped region and the fourth doped region. In a practical operation, the height of the second doped region may also be set to be larger than the height of the fourth doped region, and in this case, the breakdown voltage of the first transistor is higher than the breakdown voltage of the second transistor.

Thus, in the case where the first doped region and the third doped region have the same height, the two transistors may be provided with a second doped region and a fourth doped region with different heights, that is, the two transistors have different channel lengths. The transistor structure with the larger channel length may have a higher breakdown voltage, while the transistor structure with the smaller channel length may have a lower breakdown voltage, thus achieving the integration of transistor structures with different breakdown voltages.

In addition, in the embodiment, the distance between the transistors with different breakdown voltages are close in structure layout, so that the wiring complexity of a circuit structure may also be effectively reduced when the circuit structure needs to include transistor structures with different breakdown voltages.

In yet other embodiments of the disclosure, as shown in FIG. 3, the height of the structure composed of the first doped region 11 and the second doped region 12 is the same as the height of the structure composed of the third doped region 13 and the fourth doped region 14. The heights of the first doped region 11 and the third doped region 13 are the same, and the heights of the second doped region 12 and the fourth doped region 14 are the same. Herein, the doping concentration of the first doped region 11 is greater than the doping concentration of the third doped region 13.

Here, in the case where two transistors have the same height, when the heights of the first doped region and the third doped region are the same, and the heights of the second doped region and the fourth doped region are the same, the breakdown voltage of the second transistor is larger than the breakdown voltage of the first transistor by setting the doping concentration of the first doped region to be larger than the doping concentration of the third doped region.

In addition, in the embodiment, the thickness of the first sidewall layer may also be set to be smaller than the thickness of the second sidewall layer to further increase the breakdown voltage of the second transistor.

It is to be understood that other manners may also be employed for the setting of the doping concentration relationship between the first doped region and the third doped region. In a practical operation, the doping concentration of the first doped region may also be set to be smaller than the doping concentration of the third doped region, and in this case, the breakdown voltage of the first transistor is higher than the breakdown voltage of the second transistor.

Thus, in the case where two transistors have the same height, when the heights of the first doped region and the third doped region are the same, and the heights of the second doped region and the fourth doped region are the same, the two transistors may have different breakdown voltages by providing the first doped region and the third doped region with different doping concentrations, thus achieving the integration of transistor structures with different breakdown voltages.

In addition, in the embodiment, the distance between the transistors with different breakdown voltages are close in structure layout, so that the wiring complexity of a circuit structure may also be effectively reduced when the circuit structure needs to include transistor structures with different breakdown voltages.

In any of the above embodiments, as shown in FIG. 1, FIG. 2 and FIG. 3, the semiconductor structure further includes conductive plugs 19. The conductive plugs 19 are located on the first gate G1, the second gate G2, the common source-drain region 101, the first source-drain region 15 and the second source-drain region 16, and are respectively connected to the first gate G1, the second gate G2, the common source-drain region 101, the first source-drain region 15 and the second source-drain region 16.

In the embodiment of the disclosure, the first conductivity type may be N-type or P-type. When the first conductivity type is N-type, the first transistor T1 is an N-type transistor. When the first conductivity type is P-type, the first transistor T1 is a P-type transistor. Similarly, when the first conductivity type is N-type, the second transistor T2 is an N-type transistor. When the first conductivity type is P-type, the second transistor T2 is a P-type transistor.

Specifically, in the actual process, dopant atoms employed to form the N-type transistor may include, but are not limited to, one or a combination of phosphorus (P), arsenic (As) or antimony (Sb) and other N-type dopants. Similarly, dopant atoms employed to form the P-type transistor may include, but are not limited to, at least one or a combination of boron, indium and other P-type dopants.

The embodiments of the disclosure further provide a method for manufacturing a semiconductor structure. As shown in FIG. 4, the method includes the following steps.

At S101, a substrate is provided.

At S102, a pre-doped region of a first doping type is formed at an upper part of the substrate.

At S103, the pre-doped region is etched to form a first active column and a second active column.

At S104, a sidewall material layer is formed, and the sidewall material layer is etched to respectively form a first sidewall layer surrounding a lower part of the first active column and a second sidewall layer surrounding a lower part of the second active column.

At S105, a second doping type doping process is performed to respectively form a second doped region at the upper part of the first active column which is not surrounded by the first sidewall layer and a fourth doped region at the upper part of the second active column which is not surrounded by the second sidewall layer. Herein, the lower part of the first active column and the lower part of the second active column which are not subjected to the second doping type doping process and are surrounded by the first sidewall layer and the second sidewall layer constitute a first doped region and a third doped region, respectively.

At S106, a gate material layer is formed, and the gate material layer is etched to respectively form a first gate surrounding at least the sidewall of the second doped region and a second gate surrounding at least the sidewall of the fourth doped region.

Further description is made below to the method provided in the embodiment of the disclosure with reference to the drawings.

FIG. 5-FIG. 15 are process flow diagrams during manufacturing a semiconductor structure according to an embodiment of the disclosure.

Figure 5:
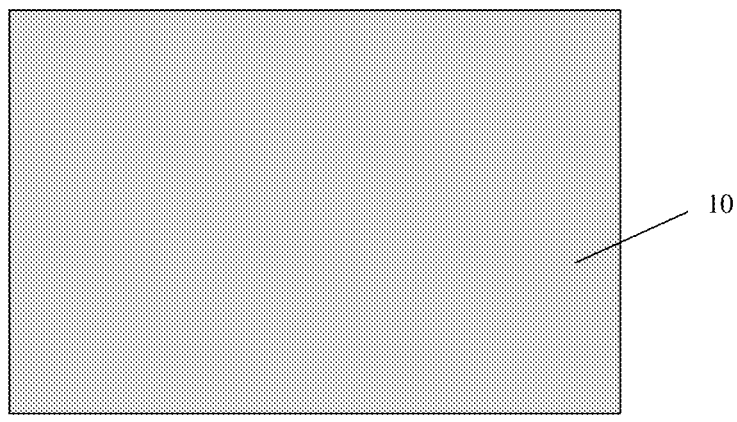
FIG. 5-FIG. 15 are process flow diagrams during manufacturing a semiconductor structure according to an embodiment of the disclosure.

First, S101 is executed. As shown in FIG. 5, a substrate 10 is provided.

Here, the substrate may be a semiconductor substrate. The material of the semiconductor substrate specifically includes an elemental semiconductor material (such as a silicon (S1) substrate, a germanium (Ge) substrate), or III-V compound semiconductor materials (such as a gallium nitride (GaN) substrate, a gallium arsenide (GaAs) substrate, an indium phosphide (InP) substrate), or II-VI compound semiconductor materials, or an organic semiconductor material or other semiconductor materials known in the art. In a specific embodiment, the substrate is a silicon substrate.

Figure 6:
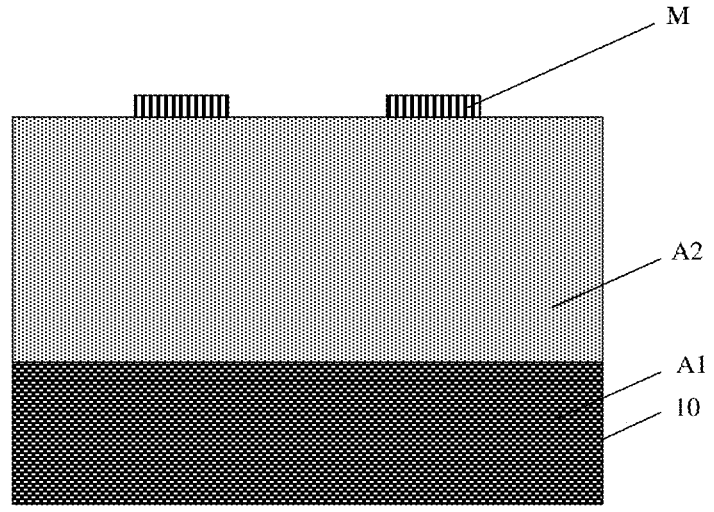

Then, S102 is executed. As shown in FIG. 6, a pre-doped region A2 of a first doping type is formed at an upper part of the substrate 10.

In some embodiments, before a pre-doped region A2 of a first doping type is formed at an upper part of the substrate 10, the method further includes the following operation.

A doped well region A1 of a first doping type is formed at the lower part of the substrate 10. Herein, the doping concentration of the doped well region A1 is higher than the doping concentration of the pre-doped region A2.

Continuously referring to FIG. 5, after the doped well region A1 and the pre-doped region A2 are formed, the following operations are further included.

A mask material layer (not shown in the figure) is formed on the pre-doped region A2.

A patterning process is performed on the mask material layer (not shown in the figure) to form a mask layer M.

Here, the mask layer may be used as a mask when executing the subsequent process.

Figure 7:
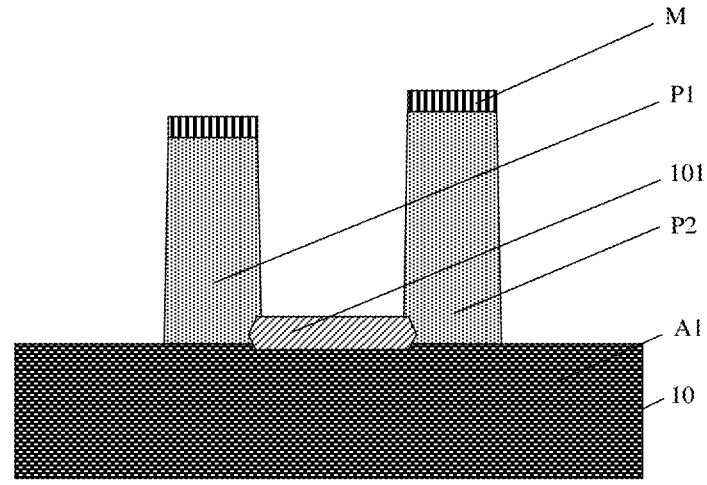

Next, S103 is executed. As shown in FIG. 7, the pre-doped region A2 is etched to form a first active column P1 and a second active column P2.

In an actual operation, the mask layer M may be used as a mask for etching to form the first active column P1 and the second active column P2. Herein, the etching process used for etching the pre-doped region may include, but is not limited to, one or a combination of a dry etching process and a wet etching process.

In some embodiments, after the pre-doped region A2 is etched to form a first active column P1 and a second active column P2, the method further includes the following operation.

The top of the first active column P1 is etched so that the upper surface of the first active column P1 is lower than the upper surface of the second active column P2.

In a practical operation, after the pre-doped region A2 is etched to form a first active column P1 and a second active column P2 and before a sidewall material layer S is formed, the method further includes the following operation.

A common source-drain region 101 is formed on the substrate 10 between the first active column P1 and the second active column P2, in which the common source-drain region 101 is connected to the lower part of the first active column P1 and the lower part of the second active column P2.

Here, the material of the common source-drain region 101 includes, but is not limited to, silicon germanium or other conductive materials.

In the actual process, the common source-drain region may be formed by executing a doping process on the substrate, and the dopant used in the doping process includes, but is not limited to germanium, etc. After the doping process is executed, an annealing process may also be executed to obtain the common source-drain region with good performances. It is to be understood that the common source-drain region may also be formed by regrowing a material layer on the substrate. Any manners by which the structure of the common source-drain region can be obtained may be used as the forming process of the common source-drain region, which is not specifically limited here.

Figure 8:
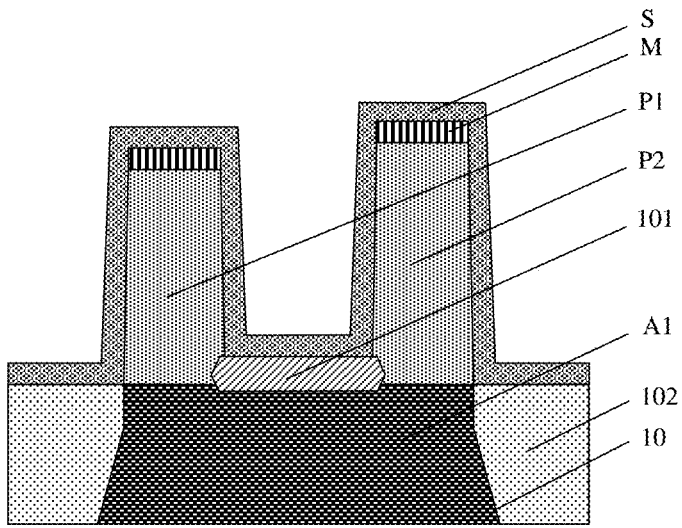
Figure 9:
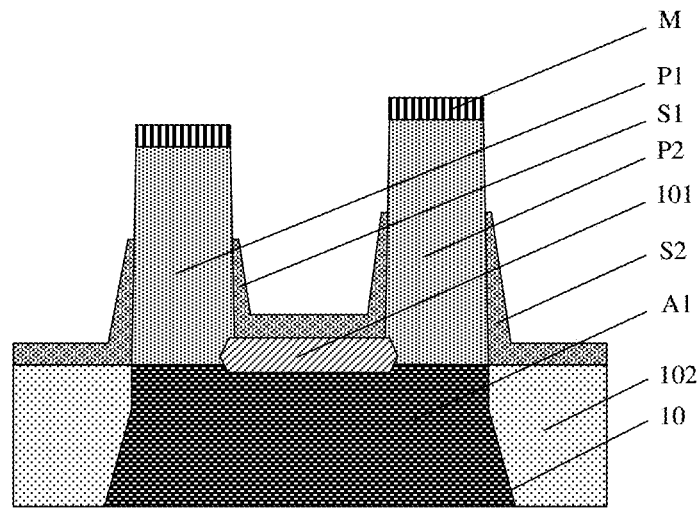

Then, S104 is executed. As shown in FIG. 8 to FIG. 9, a sidewall material layer S is formed, and the sidewall material layer S is etched to respectively form a first sidewall layer S1 surrounding a lower part of the first active column P1 and a second sidewall layer S2 surrounding a lower part of the second active column P2.

Here, the materials of the first sidewall layer and the second sidewall layer include, but are not limited to, one or a combination of an oxide, a nitride, a nitrogen oxide, etc. Specifically, in some embodiments, the materials of the first sidewall layer and the second sidewall layer may include, but are not limited to, one or a combination of a composite layer of an oxide plus a nitride (an ON structure), a composite layer of an oxide plus a nitride plus an oxide (an ONO structure) or a composite layer of a nitride plus an oxide plus a nitride (a NON structure).

In some embodiments, the operation of forming a sidewall material layer S, and etching the sidewall material layer S to respectively form a first sidewall layer S1 surrounding a lower part of the first active column P1 and a second sidewall layer S2 surrounding a lower part of the second active column P2 includes the following operations.

A sidewall material layer S is formed.

The sidewall material layer S located on the top and sidewall of the first active column P1 is etched to form the first sidewall layer S1 surrounding the lower part of the first active column P1.

The sidewall material layer S located on the top and sidewall of the second active column P2 is etched, and an etching parameter is controlled, such that a second sidewall layer S2 surrounding the lower part of the second active column P2 is formed and such that the height of the upper part of the second active column P1 not surrounded by the second sidewall layer S2 is the same as the height of the upper part of the first active column P1 not surrounded by the first sidewall layer S1.

In the embodiment, the height of the first sidewall layer is smaller than the height of the second sidewall layer.

In some embodiments, the height of each of the first sidewall layer S1 and the second sidewall layer S2 is between 20 nm and 500 nm, for example, 50 nm, 100 nm, 120 nm, 150 nm, 200 nm, 300 nm, 400 nm, etc.

In some embodiments, the upper surface of the first sidewall layer is flush with the upper surface of the first doped region, and the upper surface of the second sidewall layer is flush with the upper surface of the third doped region.

It is to be understood that since the upper surface of the sidewall layer is flush with the upper surface of the doped region which is adjacent to the substrate, the height of the doped region which is adjacent to the substrate increases, when the height of the sidewall layer increases. The increase of the height of the sidewall layer may effectively improve the breakdown voltage of the finally formed semiconductor structure, in the case where other factors are the same.

In addition, in the case where other factors keep constant, the increase of thickness of the sidewall layer may also improve the breakdown voltage of the semiconductor structure.

Figure 10:
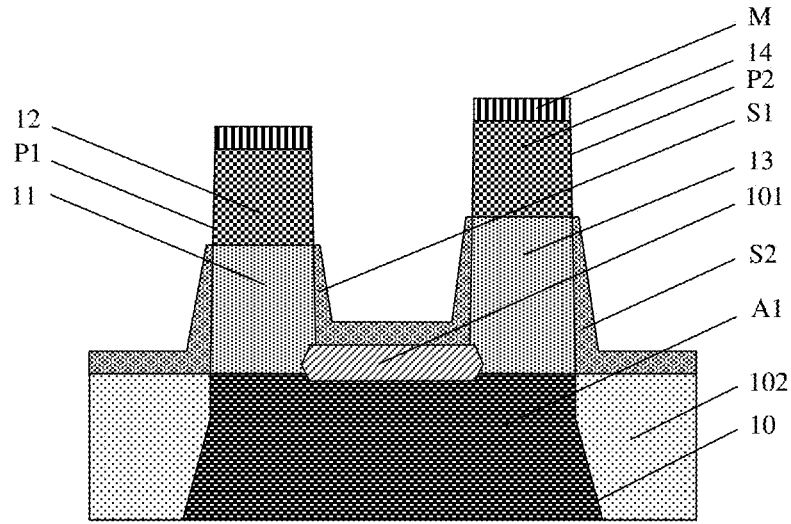

S105 is continuously executed. As shown in FIG. 10, a second doping type doping process is performed to respectively form a second doped region 12 at the upper part of the first active column P1 which is not surrounded by the first sidewall layer S1 and a fourth doped region 14 at the upper part of the second active column P2 which is not surrounded by the second sidewall layer S2. Herein, the lower part of the first active column P1 and the lower part of the second active column P2 which are not subjected to the second doping type doping process and are surrounded by the first sidewall layer S1 and the second sidewall layer S2 constitute a first doped region 11 and a third doped region 13, respectively.

In the embodiment of the disclosure, the first doping type is different from the second doping type. When the first doping type is N-type, the second doping type may be P-type. When the first doping type is P-type, the second doping type may be N-type.

Specifically, when the first doping type is N-type, dopant atoms used to execute the first doping type doping process may include, but are not limited to, one or a combination of phosphorus (P), arsenic (As) or antimony (Sb), and other N-type dopants. When the first doping type is P-type, the dopant atoms used to execute the first doping type doping process may include, but are not limited to, at least one or a combination of boron, indium, and other P-type dopants.

It is to be understood that when the second doping type is N-type, the dopant atoms used to execute the second doping type doping process may include, but are not limited to, one or a combination of phosphorus (P), arsenic (As) or antimony (Sb), and other N-type dopants. When the second doping type is P-type, the dopant atoms used to execute the second doping type doping process may include, but are not limited to, at least one or a combination of boron, indium, and other P-type dopants.

Figure 11:
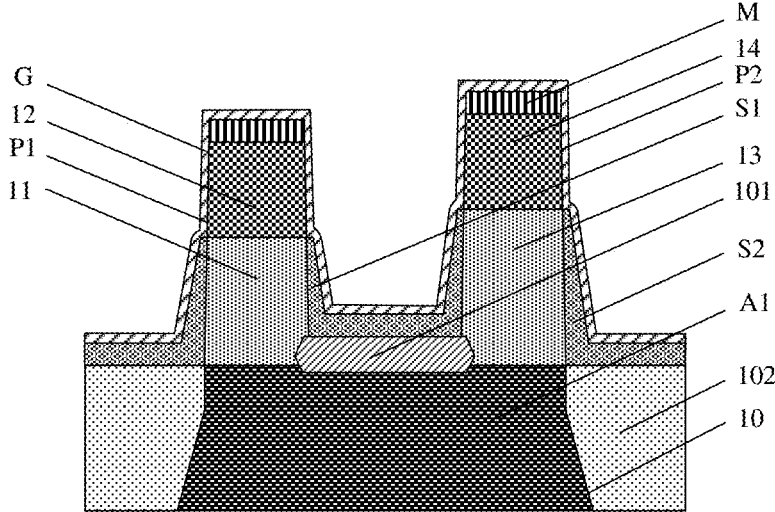
Figure 12:
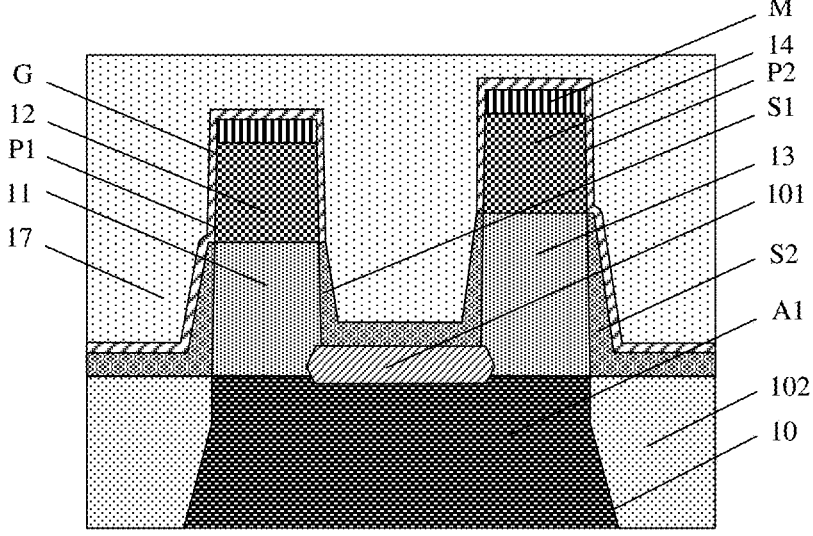
Figure 13:
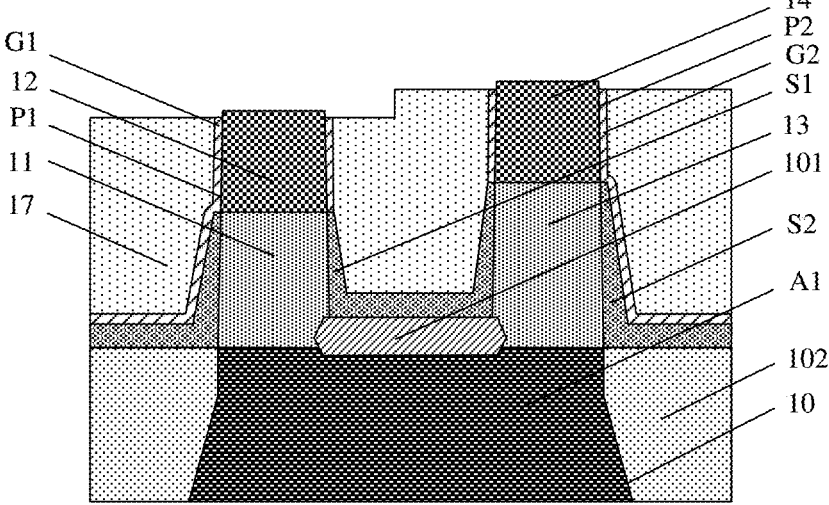

Finally, S106 is executed. As shown in FIG. 11 to FIG. 13, a gate material layer G is formed, and the gate material layer G is etched to respectively form a first gate G1 which at least surrounds the sidewall of the second doped region 12 and a second gate G2 which at least surrounds the sidewall of the fourth doped region 14.

In some embodiments, the operation of forming a gate material layer G and etching the gate material layer G to respectively form a first gate G1 which at least surrounds the sidewall of the second doped region 12 and a second gate G2 which at least surrounds the sidewall of the fourth doped region 14 includes the following operations.

A gate material layer G is formed. The gate material layer G covers the first sidewall layer S1, the second sidewall layer S2, the sidewall of the second doped region 12, the sidewall of the fourth doped region 14 and the top and sidewall of the mask layer M.

The gate material layer G on the surfaces of the first sidewall layer S1 and the second sidewall layer S2 located above the common source-drain region 101 and between the first active column P1 and the second active column P2 is removed, so that the first sidewall layer S1 and the second sidewall layer S2 located above the common source-drain region 101 and between the first active column P1 and the second active column P2 are exposed.

An insulating layer 17 is formed on the substrate 10. The insulating layer 17 covers the gate material layer G, and the first sidewall layer S1 and the second sidewall layer S2 exposed by the gate material layer G.

A planarization process is executed on the insulating layer 17, such that part of the insulating layer 17 located around and above the mask layer M is removed, and the mask layer M and the gate material layer G on the top and sidewall of the mask layer M are removed, such that the upper surfaces of the second doped region 12 and the fourth doped region 14 are exposed.

An etch-back process is executed on the gate material layer G, such that part of the gate material layer G located on the sidewalls of the second doped region 12 and the fourth doped region 14 is removed and the second doped region 12 and the fourth doped region 14 protrude from the upper surface of the insulating layer 17. Herein, the remaining gate material layer G constitutes a first gate G1 and a second gate G2. The first gate G1 surrounds the sidewall of the second doped region 12 and the second gate G2 surrounds the sidewall of the fourth doped region 14.

Figure 14:
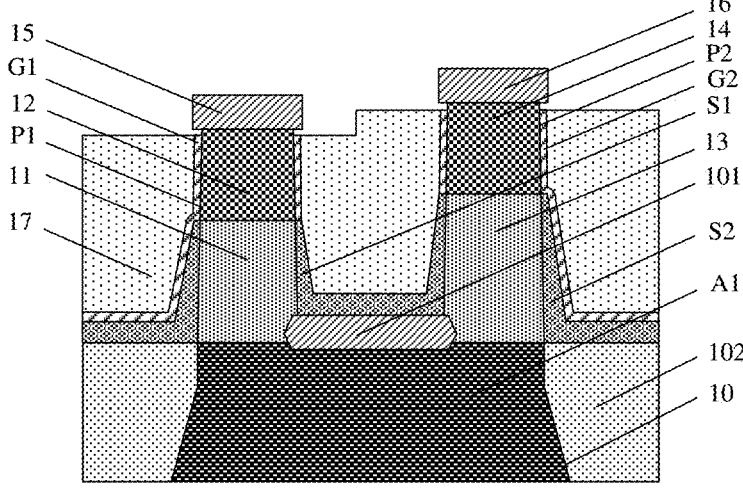

In some embodiments, as shown in FIG. 14, after a first gate G1 and a second gate G2 are formed, the following operation is further included.

A first source-drain region 15 and a second source-drain region 16 are formed on the top of the second doped region 12 and the top of the fourth doped region 14, respectively.

Here, the materials of the first source-drain region and the second source-drain region may be the same and may be different. In some embodiments, the materials of the first source-drain region and the second source-drain region include, but are not limited to, silicon germanium and the like.

It is to be understood that the formation of the material involved in any of the above embodiments may be formed by using one or more thin film deposition processes. Various thin film deposition processes include, but are not limited to, a Chemical Vapor Deposition (CVD) process, a Plasma Enhanced Chemical Vapor Deposition (PECVD) process, an Atomic Layer Deposition (ALD) process or a combination thereof.

Figure 15:
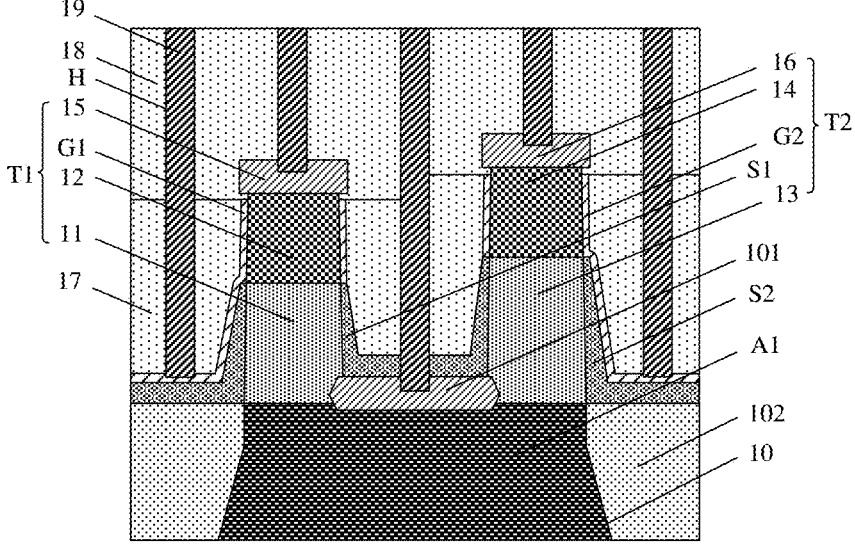
Figure 16:
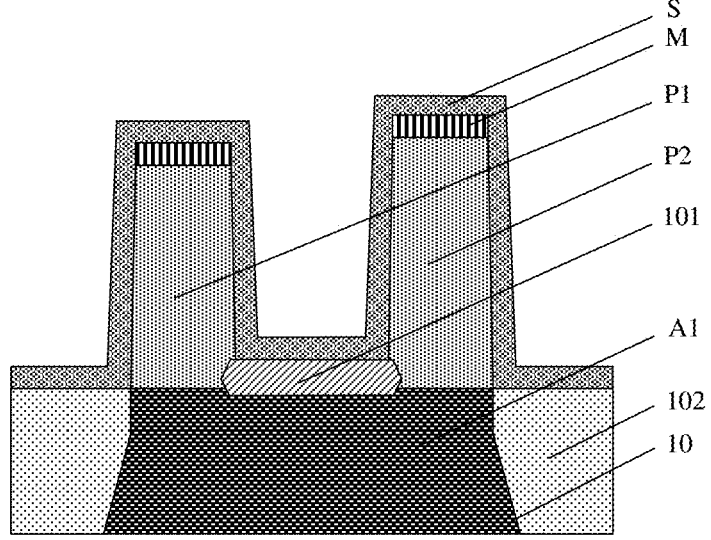
FIG. 16-FIG. 20 are process flow diagrams during manufacturing a semiconductor structure according to another embodiment of the disclosure.
Figure 17:
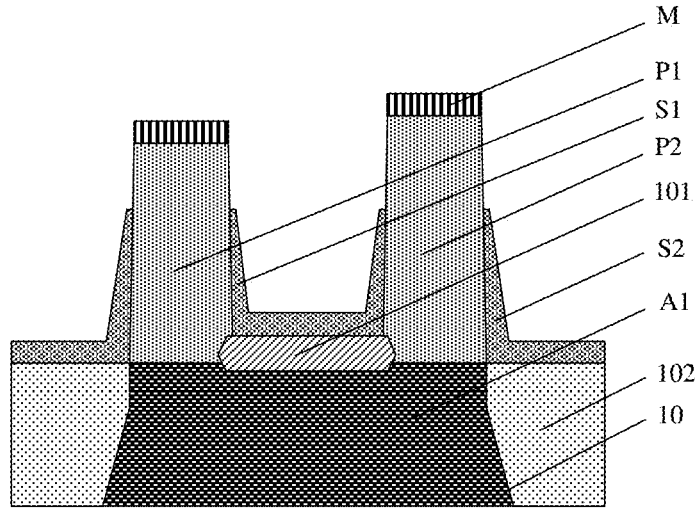

In some embodiments, as shown in FIG. 15, after a first source-drain region 15 and a second source-drain region 16 are formed, the method further includes the following operations.

A dielectric layer 18 is formed.

The dielectric layer 18 is etched to form a plurality of through holes H for conductive plugs, which at least expose the first source-drain region 15, the second source-drain region 16 and the common source-drain region 101.

The plurality of through holes H for conductive plugs are filled to form conductive plugs 19.

Here, the material of the conductive plugs includes, but is not limited to, polysilicon, titanium nitride or tungsten, etc.

In the embodiment, the first doped region 11, the second doped region 12, the first gate G1 and the first source-drain region 15 constitute the first transistor T1, and the third doped region 13, the fourth doped region 14, the second gate G2 and the second source-drain region 16 constitute the second transistor T2.

It is to be understood that the second doped region 12 may be used as the channel region of the first transistor T1, and the fourth doped region 14 may be used as the channel region of the second transistor T2. In the embodiment, the height of the upper part of the second active column P2 not surrounded by the second sidewall layer S2 is the same as the height of the upper part of the first active column P1 not surrounded by the first sidewall layer S1. That is, the channel regions of the first transistor T1 and the second transistor T2 have the same length.

Here, the two transistors have the same channel length. Since the upper surface of the doped region is flush with the upper surface of the sidewall layer, the height of the first doped region is smaller than the height of the third doped region when the height of the first sidewall layer is smaller than the height of the second sidewall layer, the flow path of current flowing through the second transistor is extended, so that the breakdown voltage of the second transistor is larger than the breakdown voltage of the first transistor.

In addition, in the embodiment, the thickness of the first sidewall layer may also be set to be smaller than the thickness of the second sidewall layer to further increase the breakdown voltage of the second transistor.

It is to be understood that other manners may also be employed for the setting of the height relationship between the first sidewall layer and the second sidewall layer (i.e., the height relationship between the first doped region and the third doped region). In a practical operation, the height of the first sidewall layer may also be set to be larger than the height of the second sidewall layer (in this case, the height of the first doped region is larger than the height of the third doped region), and in this case, the breakdown voltage of the first transistor is higher than the breakdown voltage of the second transistor.

Thus, in the case where two transistors have the same channel length, the two transistors may have different breakdown voltages by providing the two transistors with different sidewall layer heights (that is, the doped regions surrounded by the sidewall layers have different heights), thus achieving the integration of transistor structures with different breakdown voltages.

Compared with a traditional process in which transistor structures located in different regions and having different breakdown voltages are formed separately, the transistor structures with different breakdown voltages may be obtained only by adjusting the heights of the first sidewall layer and the second sidewall layer when the breakdown voltages of the transistor structures need to be changed in the embodiments of the disclosure, so that the method for manufacturing the transistor structures with different breakdown voltages is integrated.

FIG. 16-FIG. 20 are process flow diagrams during manufacturing a semiconductor structure according to another embodiment of the disclosure.

In another embodiment of the disclosure, as shown in FIG. 6-FIG. 7 and FIG. 16-FIG. 17, after the pre-doped region A2 is etched to form a first active column P1 and a second active column P2, the method further includes the following operation.

The top of the first active column P1 is etched so that the upper surface of the first active column P1 is lower than the upper surface of the second active column P2.

The operation of forming a sidewall material layer S and etching the sidewall material layer S to respectively form a first sidewall layer S1 surrounding a lower part of the first active column P1 and a second sidewall layer S2 surrounding a lower part of the second active column P2 includes the following operations.

The sidewall material layer S is formed.

The sidewall material layer S located on the tops and sidewalls of the first active column P1 and the second active column P2 is etched to form the first sidewall layer S1 surrounding the lower part of the first active column P1 and form the second sidewall layer S2 surrounding the lower part of the second active column P2. Herein, the height of the first sidewall layer S1 is the same as the height of the second sidewall layer S2.

In the embodiment, the height of the upper part of the first active column not surrounded by the first sidewall layer is smaller than the height of the upper part of the second active column not surrounded by the second sidewall layer.

It is to be understood that in the embodiment, the materials of the first sidewall layer and the second sidewall layer may be the same as or different from the previous embodiment, which is not specifically limited here.

Figure 18:
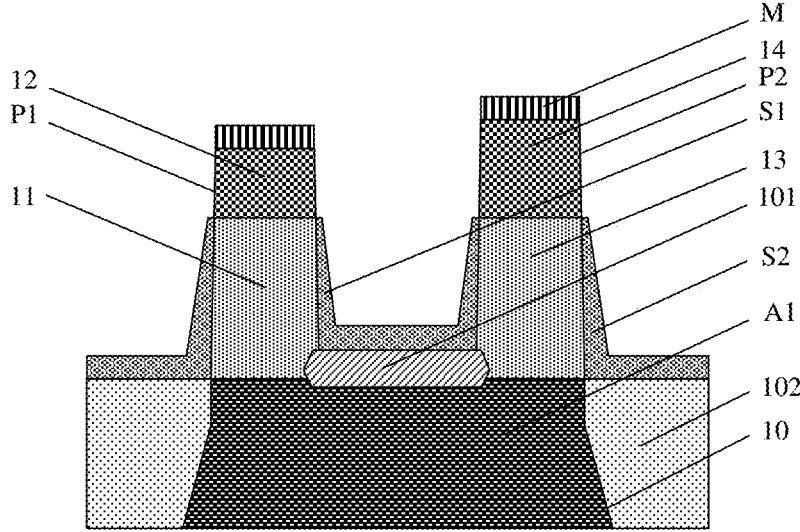
Figure 19:
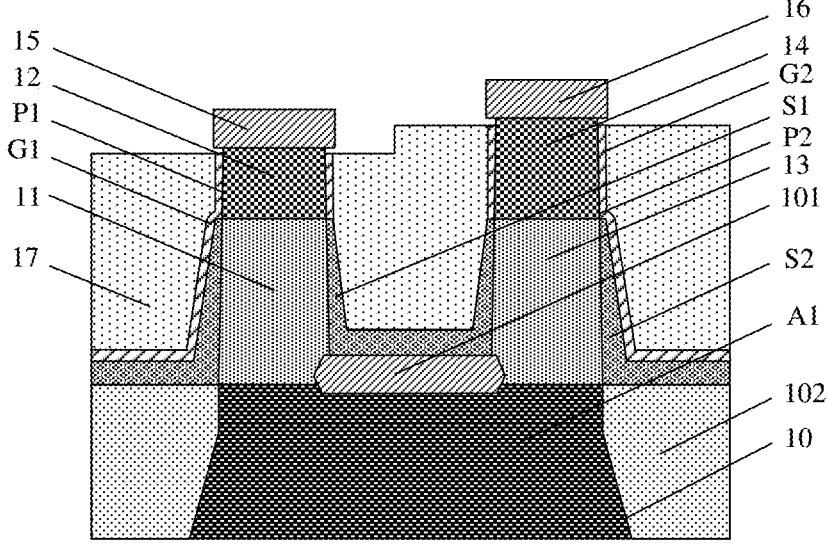

In addition, as shown in FIG. 18-FIG. 19, after the first sidewall layer and the second sidewall layer are formed, the method further includes the following operations.

A second doping type doping process is performed to respectively form a second doped region 12 at the upper part of the first active column P1 which is not surrounded by the first sidewall layer S1 and a fourth doped region 14 at the upper part of the second active column P2 which is not surrounded by the second sidewall layer S2. Herein, the lower part of the first active column P1 surrounded by the first sidewall layer S1 and the lower part of the second active column P2 surrounded by the second sidewall layer S2 which are not subjected to the second doping type doping process constitute a first doped region 11 and a third doped region 13, respectively.

A gate material layer G is formed, and the gate material layer G is etched to respectively form a first gate G1 and a second gate G2. The first gate G1 at least surrounds the sidewall of the second doped region 12 and the second gate G2 at least surrounds the sidewall of the fourth doped region 14.

Figure 20:
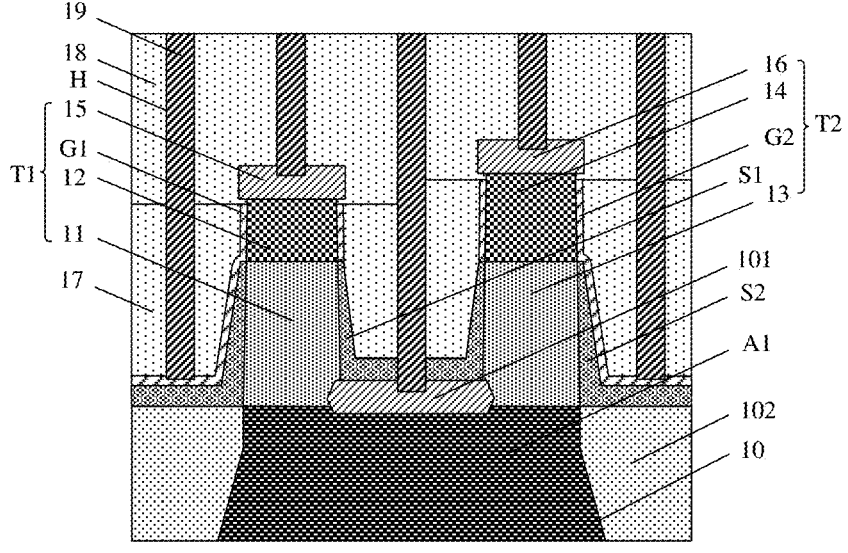

Optionally, as shown in FIG. 19 and FIG. 20, after the first gate G1 and the second gate G2 are formed, the method further includes: a step of respectively forming a first source-drain region 15 on the top of the second doped region 12 and a second source-drain region 16 on the top of the fourth doped region 14, and a step of forming conductive plugs 19.

In the embodiment, the first doped region 11, the second doped region 12, the first gate G1 and the first source-drain region 15 constitute the first transistor T1, and the third doped region 13, the fourth doped region 14, the second gate G2 and the second source-drain region 16 constitute the second transistor T2.

It is to be understood that the second doped region 12 may be used as the channel region of the first transistor T1, and the fourth doped region 14 may be used as the channel region of the second transistor T2.

Here, in the case where the first sidewall layer and the second sidewall layer have the same height (that is, the first doped region and the third doped region have the same height), when the height of the second doped region is smaller than the height of the fourth doped region, the flow path of current flowing through the second transistor is extended, so that the breakdown voltage of the second transistor is larger than the breakdown voltage of the first transistor.

In addition, in the embodiment, the thickness of the first sidewall layer may also be set to be smaller than the thickness of the second sidewall layer to further increase the breakdown voltage of the second transistor.

It is to be understood that other manners may also be employed for the setting of the height relationship between the second doped region and the fourth doped region. In a practical operation, the height of the second doped region may also be set to be larger than the height of the fourth doped region, and in this case, the breakdown voltage of the first transistor is higher than the breakdown voltage of the second transistor.

In the embodiment, the integration of transistor structures with different breakdown voltages can also be achieved, such that the distance between the transistor structures is close in structure layout. Further, the method for manufacturing transistor structures with different breakdown voltages is integrated in the embodiment.

FIG. 21-FIG. 25 are process flow diagrams during manufacturing a semiconductor structure according to yet another embodiment of the disclosure.

In yet another embodiment of the disclosure, as shown in FIG. 6 and FIG. 21-FIG. 23, the operation of etching the pre-doped region A2 to form a first active column P1 and a second active column P2 includes the following operation.

The pre-doped region A2 is etched to form a first active column P1 and a second active column P2 having the same height.

The operation of forming a sidewall material layer S and etching the sidewall material layer S to respectively form a first sidewall layer S1 surrounding a lower part of the first active column P1 and a second sidewall layer S2 surrounding a lower part of the second active column P2 includes the following operations.

The sidewall material layer S is formed.

The sidewall material layer S located on the tops and sidewalls of the first active column P1 and the second active column P2 is etched to form the first sidewall layer S1 surrounding the lower part of the first active column P1 and form the second sidewall layer S2 surrounding the lower part of the second active column P2. Herein, the height of the first sidewall layer S1 is the same as the height of the second sidewall layer S2.

Figure 21:
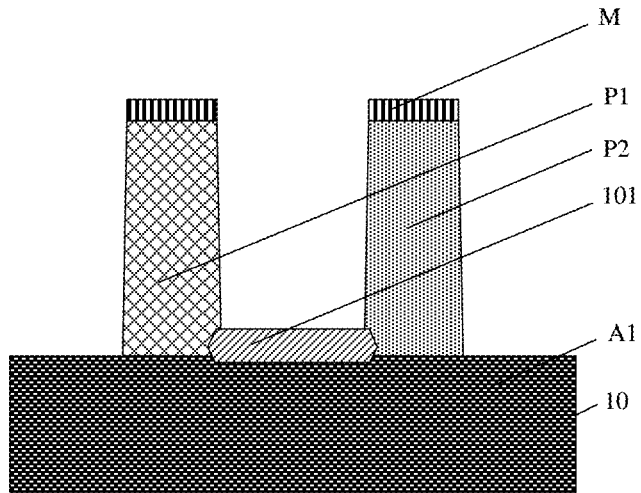
FIG. 21-FIG. 25 are process flow diagrams during manufacturing a semiconductor structure according to yet another embodiment of the disclosure.
Figure 22:
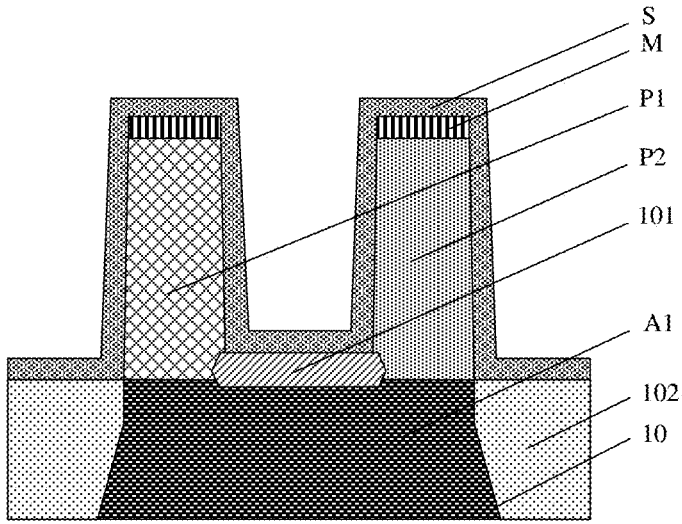
Figure 23:
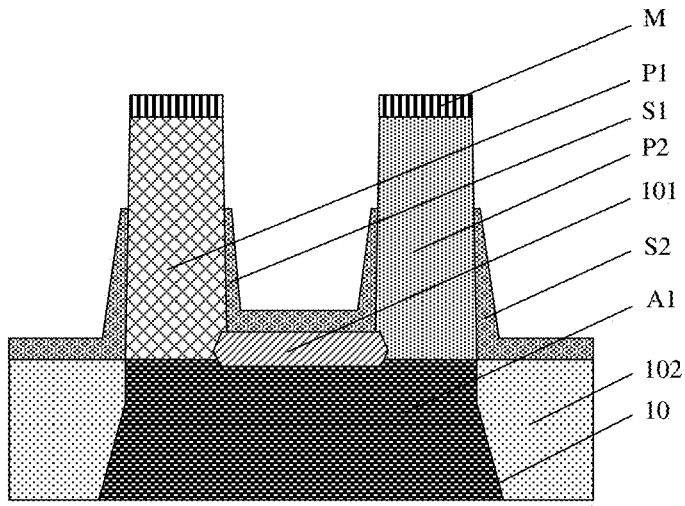

In the embodiment, as shown in FIG. 21, after the pre-doped region A2 is etched to form a first active column P1 and a second active column P2 having the same height, the method further includes the following operation.

The first doping type doping process is executed on the first active column P1 again, so that the doping concentration of the first active column P1 is greater than the doping concentration of the second active column P2.

Figure 24:
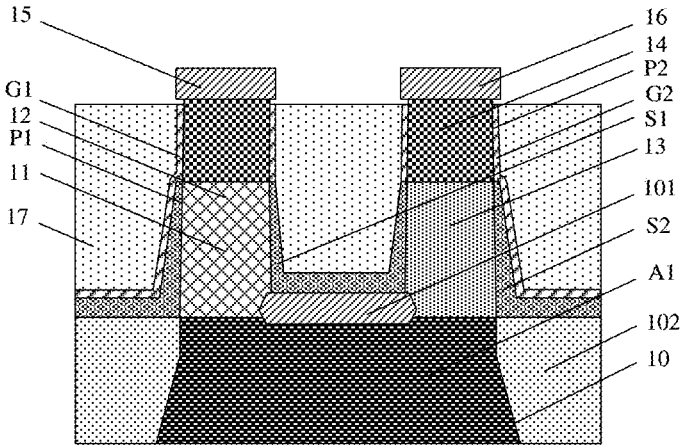
Figure 25:
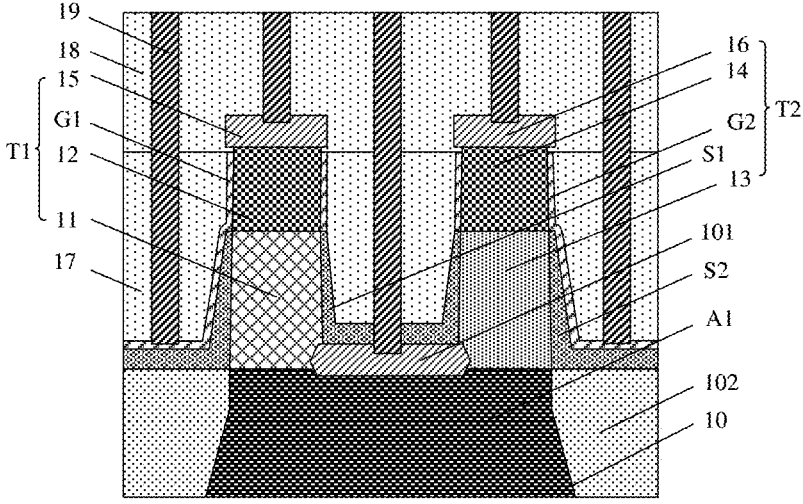

Optionally, as shown in FIG. 24 and FIG. 25, after the first active column P1 with a larger doping concentration is formed, the method further includes the following operations.

A second doping type doping process is executed to respectively form a second doped region 12 at the upper part of the first active column P1 which is not surrounded by the first sidewall layer S1 and a fourth doped region 14 at the upper part of the second active column P2 which is not surrounded by the second sidewall layer S2.

A first source-drain region 15 and a second source-drain region 16 are formed on the top of the second doped region 12 and the top of the fourth doped region 14 respectively, and conductive plugs 19 are formed.

In the embodiment, the first doped region 11, the second doped region 12, the first gate G1 and the first source-drain region 15 constitute the first transistor T1, and the third doped region 13, the fourth doped region 14, the second gate G2 and the second source-drain region 16 constitute the second transistor T2. Herein, the second doped region 12 may be used as the channel region of the first transistor T1, and the fourth doped region 14 may be used as the channel region of the second transistor T2.

In the embodiment, from the fact that the heights of the first active column and the second active column are the same and the heights of the first sidewall layer and the second sidewall layer are the same, it is to be understood that the heights of the first and third doped regions are the same, the heights of the second and fourth doped regions are the same, and the heights of the two transistors are also the same.

Therefore, when the two transistors have the same height, the heights of the first doped region and the third doped region are the same, and the heights of the second doped region and the fourth doped region are also the same, the breakdown voltage of the second transistor is larger than the breakdown voltage of the first transistor by setting the doping concentration of the first doped region to be larger than the doping concentration of the third doped region.

In addition, in the embodiment, the thickness of the first sidewall layer may also be set to be smaller than the thickness of the second sidewall layer to further increase the breakdown voltage of the second transistor.

It is to be understood that other manners may also be employed for the setting of the doping concentration relationship between the first doped region and the third doped region. In a practical operation, the doping concentration of the first doped region may also be set to be smaller than the doping concentration of the third doped region, and in this case, the breakdown voltage of the first transistor is higher than the breakdown voltage of the second transistor.

In the embodiment, the integration of transistor structures with different breakdown voltages can also be achieved, such that the distance between the transistor structures is close in structure layout. Further, the method for manufacturing transistor structures with different breakdown voltages is integrated in the embodiment.

It is to be noted that the semiconductor device and the method for manufacturing the same provided by the embodiments of the disclosure may be applied to any semiconductor device including the structure, which is not specifically limited here. The embodiment of the method for manufacturing a semiconductor device provided by the disclosure has the same concept as the embodiment of the semiconductor device; and the technical features in the technical solutions described in embodiments may be arbitrarily combined without conflict.

The above is only preferred embodiments of the disclosure and not intended to limit the protection scope of the disclosure. Any modifications, equivalent replacements, improvements and the like made within the spirit and principle of the disclosure shall fall within the protection scope of the disclosure.

The invention claimed is:

1. A semiconductor structure, comprising:

a substrate;

a first transistor and a second transistor protruding from the substrate, wherein the first transistor at least comprises a first doped region and a second doped region arranged from bottom to top, the second transistor at least comprises a third doped region and a fourth doped region arranged from bottom to top, wherein the first doped region and the third doped region have a first conductivity type, the second doped region and the fourth doped region have a second conductivity type, and a breakdown voltage of the first transistor is smaller than a breakdown voltage of the second transistor and a height of a structure composed of the first doped region and the second doped region is smaller than a height of a structure composed of the third doped region and the fourth doped region, a height of the first doped region is smaller than a height of the third doped region, and a height of the second doped region is the same as that of the fourth doped region.

2. The semiconductor structure of claim 1, wherein the semiconductor structure further comprises a first sidewall layer and a second sidewall layer, wherein the first sidewall layer covers a sidewall of the first doped region, the second sidewall layer covers a sidewall of the third doped region, an upper surface of the first sidewall layer is flush with an upper surface of the first doped region, and an upper surface of the second sidewall layer is flush with an upper surface of the third doped region.

3. The semiconductor structure of claim 2, wherein a height of each of the first sidewall layer and the second sidewall layer is between 20 nm and 500 nm.

4. The semiconductor structure of claim 1, wherein the semiconductor structure further comprises a doped well region, which is located in the substrate and below the first transistor and the second transistor, and wherein the doped well region has the first conductivity type, and a doping concentration of the doped well region is higher than a doping concentration of each of the first doped region and the third doped region.

5. The semiconductor structure of claim 1, wherein the semiconductor structure further comprises a common source-drain region, which is located on the substrate between the first transistor and the second transistor, and wherein the common source-drain region is connected to the first doped region and the third doped region.

6. The semiconductor structure of claim 5, wherein the first transistor further comprises a first gate, which at least surrounds a sidewall of the second doped region, and wherein the second transistor further comprises a second gate, which at least surrounds a sidewall of the fourth doped region.

7. The semiconductor structure of claim 6, wherein the first transistor further comprises a first source-drain region, which is located on the second doped region, and wherein the second transistor further comprises a second source-drain region, which is located on the fourth doped region.

8. The semiconductor structure of claim 7, wherein the semiconductor structure further comprises conductive plugs, which are located on the first gate, the second gate, the common source-drain region, the first source-drain region and the second source-drain region, and are respectively connected to the first gate, the second gate, the common source-drain region, the first source-drain region and the second source-drain region.

9. A method for manufacturing a semiconductor structure as in claim 1, comprising:

providing a substrate;

forming a pre-doped region of a first doping type at an upper part of the substrate;

etching the pre-doped region to form a first active column and a second active column;

forming a sidewall material layer and etching the sidewall material layer to respectively form a first sidewall layer surrounding a lower part of the first active column and a second sidewall layer surrounding a lower part of the second active column;

performing a second doping type doping process to respectively form a second doped region at an upper part of the first active column which is not surrounded by the first sidewall layer and a fourth doped region at an upper part of the second active column which is not surrounded by the second sidewall layer, wherein the lower part of the first active column surrounded by the first sidewall layer and the lower part of the second active column surrounded by the second sidewall layer, which are not subjected to the second doping type doping process, constitute a first doped region and a third doped region, respectively; and forming a gate material layer, and etching the gate material layer to respectively form a first gate and a second gate, wherein the first gate at least surrounds a sidewall of the second doped region and the second gate at least surrounds a sidewall of the fourth doped region.

10. The method of claim 9, after etching the pre-doped region to form a first active column and a second active column, further comprising:

etching a top of the first active column so that an upper surface of the first active column is lower than an upper surface of the second active column, wherein the forming a sidewall material layer and etching the sidewall material layer to respectively form a first sidewall layer surrounding a lower part of the first active column and a second sidewall layer surrounding a lower part of the second active column comprises:

forming the sidewall material layer;

etching the sidewall material layer located on the top and sidewall of the first active column to form the first sidewall layer surrounding the lower part of the first active column; and etching the sidewall material layer located on a top and sidewall of the second active column, and controlling an etching parameter, such that the second sidewall layer surrounding the lower part of the second active column is formed, and such that a height of the upper part of the second active column which is not surrounded by the second sidewall layer is the same as a height of the upper part of the first active column which is not surrounded by the first sidewall layer.

11. The method of claim 9, prior to forming a pre-doped region of a first doping type at an upper part of the substrate, further comprising:

forming a doped well region of a first doping type at a lower part of the substrate, wherein a doping concentration of the doped well region is higher than a doping concentration of the pre-doped region.

12. The method of claim 9, after etching the pre-doped region to form a first active column and a second active column and prior to forming a sidewall material layer, further comprising:

forming a common source-drain region on the substrate between the first active column and the second active column, the common source-drain region being connected to the lower part of the first active column and the lower part of the second active column.

13. The method of claim 12, after forming a first gate and a second gate, further comprising:

forming a first source-drain region on a top of the second doped region and a second source-drain region on a top of the fourth doped region, respectively.

14. The method of claim 13, after forming a first source-drain region and a second source-drain region, further comprising:

forming a dielectric layer;

etching the dielectric layer to form a plurality of through holes for conductive plugs, the plurality of through holes for conductive plugs at least exposing the first source-drain region, the second source-drain region and the common source-drain region; and filling the plurality of through holes for conductive plugs to form the conductive plugs.

\* \* \* \* \*